US009218903B2

(12) United States Patent
Sun et al.

(10) Patent No.: US 9,218,903 B2
(45) Date of Patent: Dec. 22, 2015

(54) RECONFIGURABLE MULTI-STACK INDUCTOR

(71) Applicant: International Business Machines Corporation, Armonk, NY (US)

(72) Inventors: Pinping Sun, Fishkill, NY (US); Chengwen Pei, Danbury, CT (US); Zheng Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 14/037,415

(22) Filed: Sep. 26, 2013

(65) Prior Publication Data

US 2015/0084733 A1   Mar. 26, 2015

(51) Int. Cl.
| | |
|---|---|
| H01F 5/00 | (2006.01) |
| H01F 27/28 | (2006.01) |
| H01F 27/36 | (2006.01) |
| H01F 38/30 | (2006.01) |

(Continued)

(52) U.S. Cl.
CPC .......... *H01F 27/362* (2013.01); *H01F 17/0013* (2013.01); *H01F 27/2804* (2013.01); *H01F 27/289* (2013.01); *H01F 27/2871* (2013.01); *H01F 41/041* (2013.01); *H01F 2017/008* (2013.01); *H01F 2027/2809* (2013.01)

(58) Field of Classification Search
CPC .................................. H01F 5/00; H01F 27/28
USPC .................... 336/200, 232, 84 R, 84 C, 84 M
See application file for complete search history.

(56) References Cited

U.S. PATENT DOCUMENTS

| 5,831,331 A | 11/1998 | Lee |
| 6,124,624 A | 9/2000 | Van Roosmalen et al. |

(Continued)

FOREIGN PATENT DOCUMENTS

| CN | 102185578 A | 9/2011 |
| JP | 2002151953 A * | 5/2002 |

(Continued)

OTHER PUBLICATIONS

International Search Report, Application No. PCT/CN2014/086876, mailing date: Dec. 26, 2014.

(Continued)

*Primary Examiner* — Tsz Chan
(74) *Attorney, Agent, or Firm* — Keivan Razavi; Steven Meyers (57) ABSTRACT

A reconfigurable multi-stack inductor formed within a semiconductor structure may include a first inductor structure located within a first metal layer of the semiconductor structure, a first ground shielding structure located within the first metal layer that is electrically isolated from and circumferentially bounds the first inductor structure, and a second inductor structure located within a second metal layer of the semiconductor structure, whereby the second inductor structure is electrically coupled to the first inductor structure. A second ground shielding structure located within the second metal layer is electrically isolated from and circumferentially bounds the second inductor structure, whereby the first and second inductor generate a first inductance value based on the first ground shielding structure and second ground shielding structure being coupled to ground, and the first and second inductor generate a second inductance value based on the first ground shielding structure and second ground shielding structure electrically floating.

11 Claims, 5 Drawing Sheets

(51) Int. Cl.
*H01F 41/04* (2006.01)
*H01F 17/00* (2006.01)

(56) References Cited

U.S. PATENT DOCUMENTS

| | | | |
|---|---|---|---|
| 6,992,366 | B2 | 1/2006 | Kim et al. |
| 7,202,768 | B1 | 4/2007 | Harvey et al. |
| 7,733,206 | B2 * | 6/2010 | Park ............................. 336/200 |
| 7,952,458 | B2 * | 5/2011 | Ezzeddine ................... 336/200 |
| 8,164,159 | B1 | 4/2012 | Armstrong et al. |
| 8,258,907 | B2 | 9/2012 | Hansen |
| 8,289,118 | B2 | 10/2012 | Chiu et al. |
| 8,531,250 | B1 * | 9/2013 | Luschas ....................... 331/167 |
| 2006/0255443 | A1 | 11/2006 | Hwang et al. |
| 2008/0055037 | A1 | 3/2008 | Watanabe et al. |
| 2008/0197963 | A1 * | 8/2008 | Muto ........................... 336/200 |
| 2009/0189725 | A1 | 7/2009 | Ding et al. |
| 2010/0045419 | A1 * | 2/2010 | Tanabe ......................... 336/200 |
| 2010/0052095 | A1 | 3/2010 | Kim |

FOREIGN PATENT DOCUMENTS

| | | | |
|---|---|---|---|
| JP | 2008016703 A | * | 1/2008 |
| WO | 2015043419 A1 | | 4/2015 |

OTHER PUBLICATIONS

Alireza Zolfaghari et al., "Stacked Inductors and Transformers in CMOS Technology", IEEE Journal of Solid-State Circuits, vol. 36, No. 4, Apr. 2001.

Rajarshi Bhattacharya et al., "PSO-Based Evolutionary Optimization for Black-Box Modeling of Arbitrary Shaped On-Chip RF Inductors", Electronics & Electrical Communication Engr. Dept. Indian Institute of Technology, Kharagpur, West Bengal—721302, India, 2006. SiRF 2006. 2006 IEEE.

Liu et al., "Configurable MCPW Based Inductor for mm-Wave Circuits and Systems", in Proc. IEEE ISCAS, May 2010, pp. 1113-1116.

Woods et al., "A Novel On-Chip Voltage-Controlled Two-State Inductor for Reconfigurable RF Circuit Designs", 2008 IEEE, pp. 1-4.

Wang et al., "Integrated Switchable Inductors with Symmetric Differential Layout", Proceedings of Asia-Pacific Microwave Conference 2006, pp. 1-4.

* cited by examiner

RECONFIGURABLE MULTI-STACK INDUCTOR

BACKGROUND a. Field of the Invention

The present invention generally relates to semiconductor devices, and particularly to on-chip inductor components.

b. Background of Invention

Many communication systems may be realized on a single chip. With an increased demand for personal mobile communications, integrated semiconductor devices such as complementary metal oxide semiconductor (CMOS) devices may, for example, include voltage controlled oscillators (VCO), low noise amplifiers (LNA), tuned radio receiver circuits, or power amplifiers (PA). Each of these VCO, LNA, PA, and tuned radio receiver circuits may, however, require on-chip inductor components in their circuit designs. Thus, there may be a need for high quality, variable on-chip inductor devices.

Several design considerations associated with forming on-chip inductor components may, for example, include quality factor (i.e., Q-factor), self-resonance frequency ($f_{SR}$), cost considerations impacted by the area occupied by the formed on-chip inductor, inductor frequency dependent tuning range, and reconfigurable discrete inductor values (e.g., $L_1$, $L_2$, etc.). Accordingly, for example, a CMOS radio frequency (RF) circuit design may benefit from, among other things, one or more on-chip inductors having a moderate Q-factor, a small occupied chip area, a high self-resonance frequency value $f_{SR}$ value, and inductance tunability for frequency band selection.

Accordingly, on-chip inductors may take either a planar form (including line and planar spiral types) or a spiral form, and may have either a fixed or variable inductance. Mixed signal and radio frequency applications may, however, require variable reactive elements (e.g., inductors or capacitors) to achieve tuning, band switching, phase locked loop functions, etc. One approach may include coupling (e.g., series connecting: $L_1+L_2+\ldots+L_n$) inductor structures using one or more switch devices. However, regardless of whether one or more inductors are coupled to generate different inductance values, the existing inductor structures still occupy the same real estate on the chip or semiconductor substrate.

Figure 1:
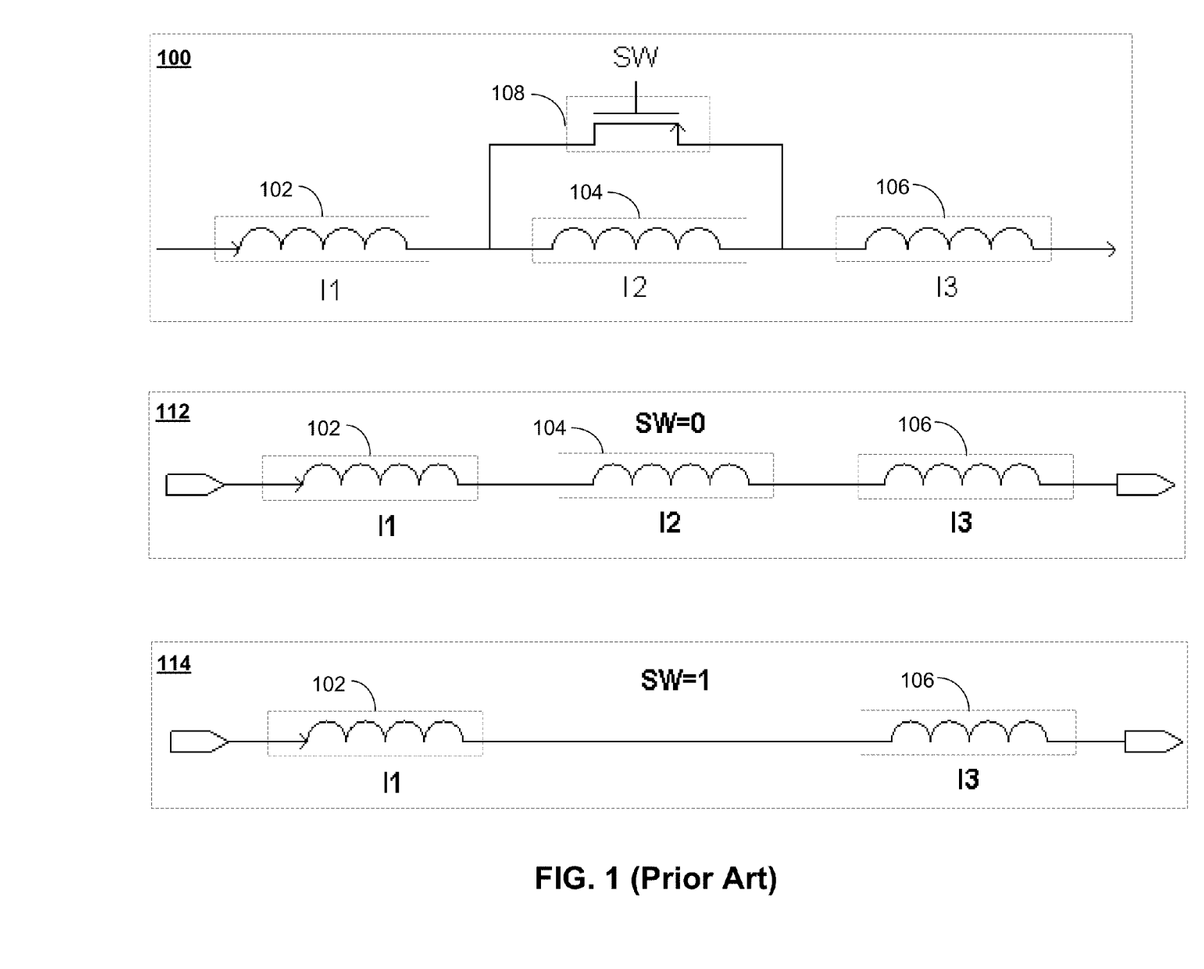
FIG. 1 is a conventional variable inductor device, as known in the art.

This is illustrated with the aid of FIG. 1. As depicted, a conventional variable inductor device 100 may include inductors 102, 104, and 106, which may be formed within a semiconductor structure. Inductor device 100 also includes a switch device 108 that is connected between the terminals of inductor 104 (i.e., 12), whereby upon actuation of the switch 108 to a closed position, inductor 104 is bypassed. Consequently, under such operating conditions (i.e., SW1=1: switch CLOSED) the inductance value (L) of variable inductor device 100 is governed by equivalent circuit 114, whereby the inductance value (L) is L=I1+I3. Alternatively, when the switch 108 is in an open position (SW1=0: switch OPEN), the inductance value of variable inductor device 100 is governed by equivalent circuit 112, whereby L=I1+I2+I3. As previously described, regardless of whether switch 108 is in an open or a closed position, the variable inductor device 100 is formed with three (3) inductors 102, 104, 106 that occupy the real-estate of the semiconductor structure.

BRIEF SUMMARY

According to at least one exemplary embodiment, a reconfigurable multi-stack inductor formed within a semiconductor structure may include a first inductor structure located within a first metal layer of the semiconductor structure, a first ground shielding structure located within the first metal layer that is electrically isolated from and circumferentially bounds the first inductor structure, and a second inductor structure located within a second metal layer of the semiconductor structure, whereby the second inductor structure is electrically coupled to the first inductor structure. The reconfigurable multi-stack inductor may also include a second ground shielding structure located within the second metal layer that is electrically isolated from and circumferentially bounds the second inductor structure, such that the first and the second inductor generate a first inductance value based on the first ground shielding structure and the second ground shielding structure being coupled to ground, and the first and the second inductor generate a second inductance value based on the first ground shielding structure and the second ground shielding structure electrically floating.

According to at least one other exemplary embodiment, a method of forming a reconfigurable multi-stack inductor structure within a semiconductor structure having a first and a second metal layer may include forming, within the first metal layer, a first inductor structure; forming, within the first metal layer, a first ground shielding structure that is electrically isolated from and circumferentially bounds the first inductor structure; forming, within the second metal layer, a second inductor structure; electrically coupling the first inductor structure and second inductor structure; forming, within the second metal layer, a second ground shielding structure that is electrically isolated from and circumferentially bounds the second inductor structure; electrically grounding the first and the second ground shielding structure to generate a first inductance value; and electrically floating the first and the second ground shielding structure to generate a second inductance value.

According to yet another exemplary embodiment, a design structure tangibly embodied in a machine readable medium for designing, manufacturing, or testing an integrated circuit is provided. The design structure may include a first inductor structure located within a first metal layer of the semiconductor structure, a first ground shielding structure located within the first metal layer that is electrically isolated from and circumferentially bounds the first inductor structure, and a second inductor structure located within a second metal layer of the semiconductor structure, whereby the second inductor structure is electrically coupled to the first inductor structure. The reconfigurable multi-stack inductor may also include a second ground shielding structure located within the second metal layer that is electrically isolated from and circumferentially bounds the second inductor structure, such that the first and the second inductor generate a first inductance value based on the first ground shielding structure and the second ground shielding structure being coupled to ground, and the first and the second inductor generate a second inductance value based on the first ground shielding structure and the second ground shielding structure electrically floating.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following described exemplary embodiments are directed to moderate-Q reconfigurable on-chip reconfigurable inductor components operable to provide an increased tuning range (e.g., ~40%) while maintaining a reduced footprint within the chip (e.g., semiconductor device).

Figure 2:
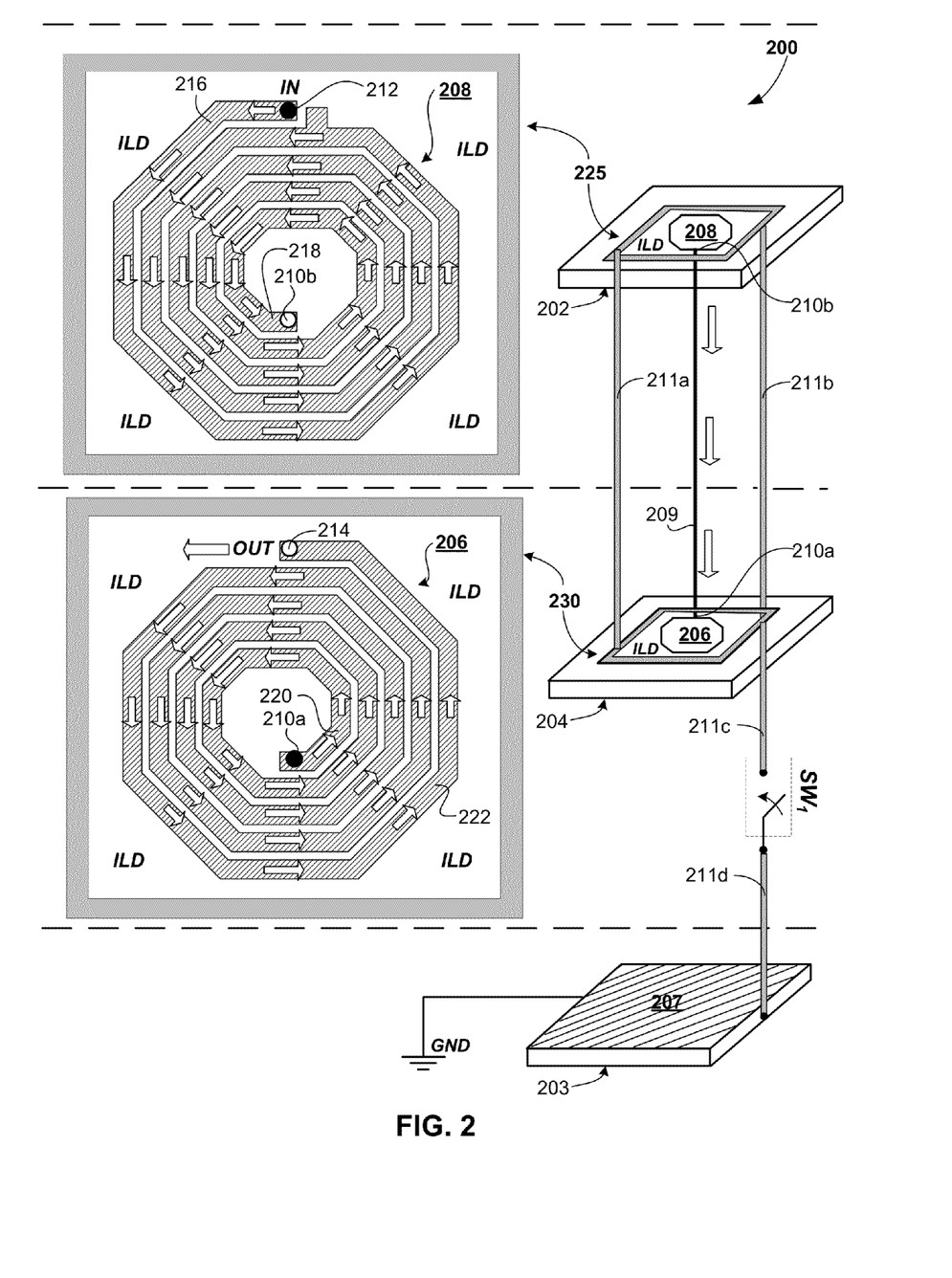
FIG. 2 illustrates an on-chip stacked reconfigurable inductor structure, according to one embodiment of the invention.

FIG. 2 depicts an exemplary embodiment of a reconfigurable on-chip stacked inductor 200. The depicted reconfigurable on-chip stacked inductor 200 may be fabricated on, for example, three metal layers 202, 203, 204 corresponding to the back end of the line (BEOL) region of a semiconductor device. A first inductor such as a first electrically conductive spiral track structure 206 (i.e., a coil) is formed in metal layer 204, while a second inductor such as a second electrically conductive spiral track structure 208 (i.e., a coil) is formed in metal layer 202. The first electrically conductive spiral track structure 206 (i.e., inductor structure 206) is electrically coupled to the second electrically conductive spiral track structure 208 (i.e., inductor structure 208) by, for example, via connection 209, whereby the lower portion of the via 210a connects the first electrically conductive spiral track structure 206 to the second spiral track structure 208 by means of the upper portion of the via 210b.

The depicted reconfigurable on-chip stacked inductor 200 may also include a first ground shielding structure such as a first spiral electrically conductive track 230 that is formed in metal layer 204. As illustrated, the first spiral electrically conductive track 230 circumferentially bounds the first electrically conductive spiral track structure 206 and is electrically isolated from the first electrically conductive spiral track structure 206 by an interlayer dielectric ILD material. Similarly, a second ground shielding structure such as a second spiral electrically conductive track 225 is formed in metal layer 202. As illustrated, the second spiral electrically conductive track 225 circumferentially bounds the second electrically conductive spiral track structure 208 and is electrically isolated from the second electrically conductive spiral track structure 208 by an interlayer dielectric ILD material.

The first and the second spiral electrically conductive tracks 230, 225 provide ground shielding, whereby parasitic signals from other adjacent electrical components are received and conducted away from the inductor structures 206, 208 by the first and the second spiral electrically conductive tracks 230, 225. This in turn mitigates the affect of other signals on the magnetic filed generated by the inductor structures 206, 208.

The first and the second ground shielding structures such as spiral electrically conductive tracks 230 and 225 are electrically coupled by electrical connections 211a and 211b. Although a single electrical connection may be sufficient to electrically couple the spiral electrically conductive tracks 230, 225, both electrical connections 211a and 211b are utilized in order to provide redundancy in electrically connecting spiral electrically conductive tracks 230 and 225. For example, if electrical connection 211a breaks, electrical connection 211b still establishes an electrical coupling between spiral electrically conductive tracks 230 and 225. Alternatively, if electrical connection 211b breaks, electrical connection 211a establishes an electrical coupling between spiral electrically conductive tracks 230 and 225. Thus, two or more electrical connections between spiral electrically conductive tracks 230 and 225 may be contemplated.

The depicted reconfigurable on-chip stacked inductor 200 also includes a switch $SW_1$ and a ground plane 207 that is formed in metal layer 203. The switch $SW_1$ provides electrical coupling between both the ground shielding structures provided by the spiral electrically conductive tracks 230, 225 and the ground plane 207. For example, when switch $SW_1$ is actuated to a closed position, the ground shielding structures provided by the spiral electrically conductive tracks 230, 225 are connected to a ground reference GND by ground plane 207. Specifically, an electrical connection is established from the connected spiral electrically conductive tracks 230, 225, electrical connection 211c, switch $SW_1$, electrical connection 211d, and ground plane 207, to ground GND. Also, for example, when switch $SW_1$ is actuated to an open position, the ground shielding structures provided by the spiral electrically conductive tracks 230, 225 are electrically floating with respect to the ground reference GND. Specifically, while an electrical connection is maintained between the spiral electrically conductive tracks 230, 225 that are connected by electrical connections 211a and 211b, an electrical path through electrical connections 211c and 211d to the ground plane 207 and, thus, GND, is broken by switch $SW_1$.

In operation, as illustrated, current may flow along the direction of the arrows from input 212 of the second electrically conductive spiral track structure 208 to output 214 of the first electrically conductive spiral track structure 206. As such, current entering at input 212 flows in a counter-clockwise direction, from the outer-most-spiral track 216 located adjacent to spiral electrically conductive track 225, to the inner-most-spiral track 218 of the electrically conductive spiral track structure 208. At the end of the inner-most-spiral track 218, current flows into the upper portion of the via 210b and out of the lower portion of the via 210a. Subsequently, from the lower portion of the via 210a, the current continues to flow in a counter-clockwise direction from the inner-most-spiral track 220 to output 214 of the outer-most-spiral track 222 of the first electrically conductive spiral track structure 206. As depicted, the outer-most-spiral track 222 of the first electrically conductive spiral track structure 206 is located adjacent to spiral electrically conductive track 230. The positive mutual inductive coupling between the first electrically conductive spiral track structure 206 and second electrically conductive spiral track structure 208 leads to a total inductance greater than the simple sum of the inductances of the two spiral structures (i.e., 206, 208) taken by themselves. For example, a two layer spiral may experience as much as four times the inductance of the two layers (e.g., 202, 204) taken separately and summed.

Each of the first and the second electrically conductive spiral track structures 206, 208 may be constructed from an electrically conductive material such as, for example, copper, tungsten, or aluminum. Moreover, each of the first and the second ground shielding structures such as spiral electrically conductive tracks 230 and 225 may similarly be constructed from an electrically conductive material such as, for example, copper, tungsten, or aluminum.

The above-described electrically conductive spiral track structures 206, 208 and the ground shielding structures provided by spiral tracks 230 and 225 may be lithographically formed (i.e., photolithography and etching) on the metal layers 202, 204 of a semiconductor device, whereby upon the deposition of an interlayer dielectric (ILD) material over each metal layer, both laterally and vertically adjacent electrically conductive spiral tracks (e.g., 206, 208, 225, 230) are insulted by the ILD material.

The thickness of the spiral tracks (e.g., 206, 208, 225, 230) may be limited to the metal layer thicknesses while the width of the spiral tracks may be designed to range from approximately 1-4 µm. Metal layer 203 may be about 0.075 µm (i.e., the bottommost metal layer), while metal layer 204 and metal layer 202 may be approximately 3 µm (i.e., the topmost two metal layers). However, different metal layer thicknesses may be contemplated depending on the choice of semiconductor technology. Moreover, although the depicted shape of the spiral tracks (e.g., 206, 208, 225, 230) are substantially octagonal, an inductor having spiral tracks of any shape may be utilized. For example, a substantially square-shaped spiral track may used to form an inductor within each of the metal layers 202, 204.

The above-described reconfigurable on-chip stacked inductor 200 may, for example, generate a first and a second inductance value based on the position of switch $SW_1$. Thus, the inductance can be configured to achieve different values based on how the switch $SW_1$ is actuated (i.e., open or closed). As depicted, switch $SW_1$ may be coupled between ground plane 207 and the first and the second spiral electrically conductive tracks 230, 225 that form the ground shielding structures. More specifically, switch $SW_1$ may be directly coupled to the first spiral electrically conductive track 230, while the second spiral electrically conductive track 225 and the first spiral electrically conductive track 230 are directly coupled by electrical connections 211a and 211b.

As previously described, upon actuation of switch $SW_1$ to an open position, the first and the second spiral electrically conductive tracks 230, 225 providing the ground shielding structures are electrically floating. Under these operating conditions, a first inductance value may be generated that is governed by the positive mutual inductive coupling between the first electrically conductive spiral track structure 206 and second electrically conductive spiral track structure 208. However, upon actuation of switch $SW_1$ to a closed position, the first and the second spiral electrically conductive tracks 230, 225 providing the ground shielding structures are electrically coupled to ground through ground plane 207. In contrast to the switch $SW_1$ being in an open position, the grounded first and second spiral electrically conductive tracks 230, 225 and ground plane confine the magnetic field generated by inductor structures 206 and 208 between the ground shielding first and second spiral electrically conductive tracks 230, 225 and the ground plane 207, which in turn generates a second increased inductance value.

Figure 4:
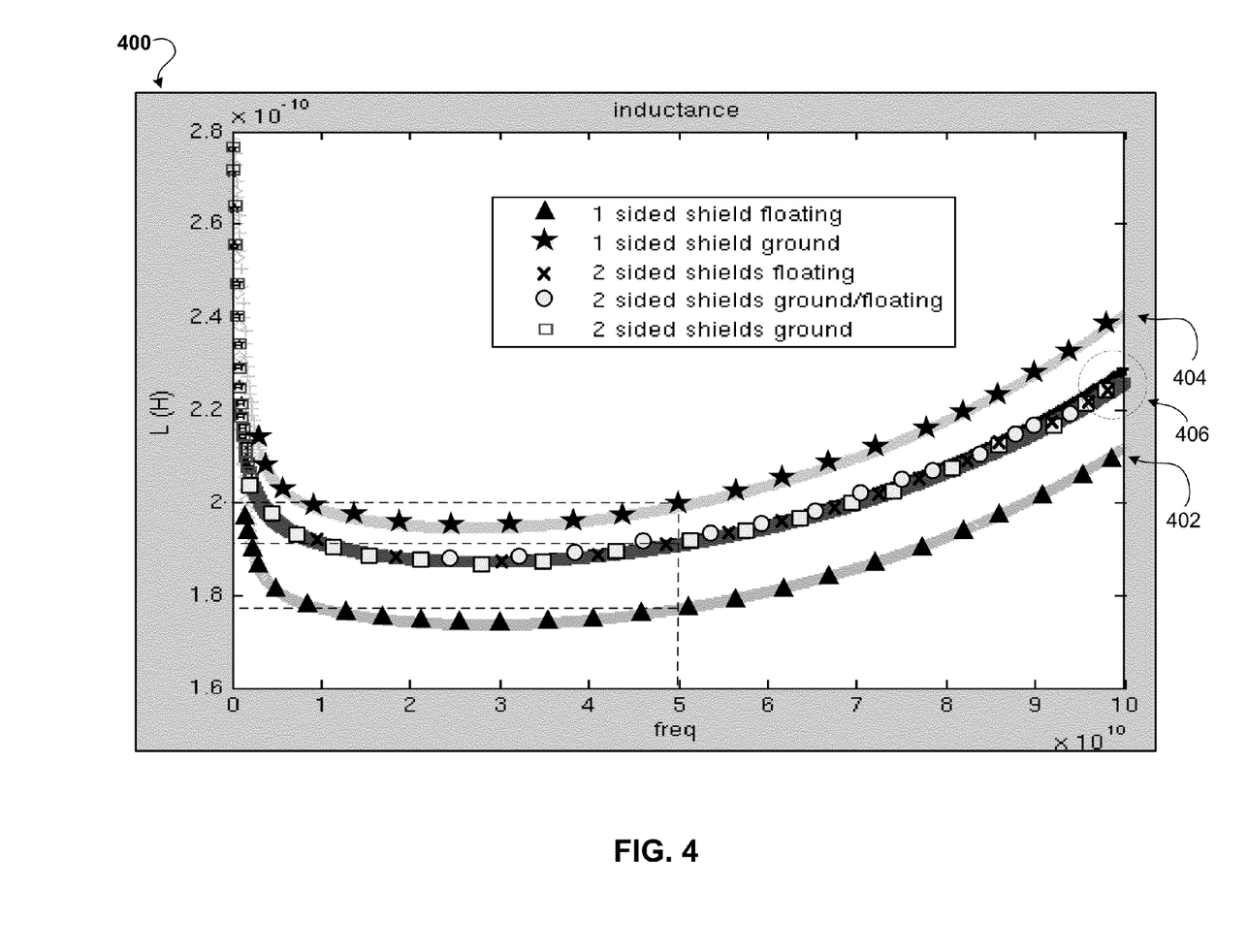
FIG. 4 is a graph depicting an inductance versus frequency characteristic for the embodiments depicted in FIGS. 2 and 3.

FIG. 4 depicts a graph 400 of experimental results corresponding to the reconfigurable on-chip stacked inductor 200 of FIG. 2. More specifically, the graph 400 corresponds to variations in inductance value (i.e., L(H)) as a function of operating frequency (i.e., freq). Using graph 400, both the inductance tuning range and the switch $SW_1$ actuation (i.e., closed or open) based inductance values are determined. Curve 402 corresponds to the inductance values of the on-chip stacked inductor 200 of FIG. 2 when switch $SW_1$ is actuated to an open position. As previously described, both the first and the second spiral electrically conductive tracks 230, 225 providing the ground shielding structures are electrically floating when switch $SW_1$ is actuated to an open position. Referring to curve 402, over an operating frequency range of 20-100 GHz, a minimum inductance value of about 174.12 pico Henrys (pH) and a maximum inductance value of about 211.83 pH is determined. Thus, based on these values, an inductance tuning range of about 37.71 pH is achieved.

Alternatively, curve 404 corresponds to the inductance values of the on-chip stacked inductor 200 of FIG. 2 when switch $SW_1$ is actuated to a closed position. As previously described, both the first and the second spiral electrically conductive tracks 230, 225 providing the ground shielding structures are electrically grounded when switch $SW_1$ is actuated to a closed position. Referring to curve 404, over an operating frequency range of 20-100 GHz, a minimum inductance value of about 194.94 pH and a maximum inductance value of about 240.45 pH is determined. Thus, based on these values, an inductance tuning range of 45.51 pH is achieved.

As illustrated in FIG. 4, for each switch $SW_1$ position, a discrete inductance curve 402, 404 may be generated. Thus, for $SW_1$=closed, curve 404 is generated, whereas for $SW_1$=open, curve 402 is generated. Actuating the switch generates different inductance values for each operating frequency. For example, at an operating frequency of 50 GHz, based on $SW_1$=open, the inductance value is about 177 pH. Alternatively, at the 50 GHz operating frequency, based on the switch $SW_1$ being actuated to a closed position, the inductance value increases to about 200 pH. Thus, by confining the generated magnetic field of the inductor structures 206, 208 to within the ground plane 207 and the ground shielding first and second spiral electrically conductive tracks 230, 225, the inductance value increases for each operating frequency relative to the operating mode where the switch $SW_1$ is actuated to an open position. Based on the results of FIG. 4, it may be determined that the on-chip stacked inductor structure 200 depicted in FIG. 2 includes both an improved tuning range (i.e., 37-45 pH) and the capability of generating configurable (e.g., $SW_1$=closed; or $SW_1$=open) inductance values (e.g., 177 pH or 200 pH) for each discrete operating frequency (e.g., f=50 GHz).

Figure 3:
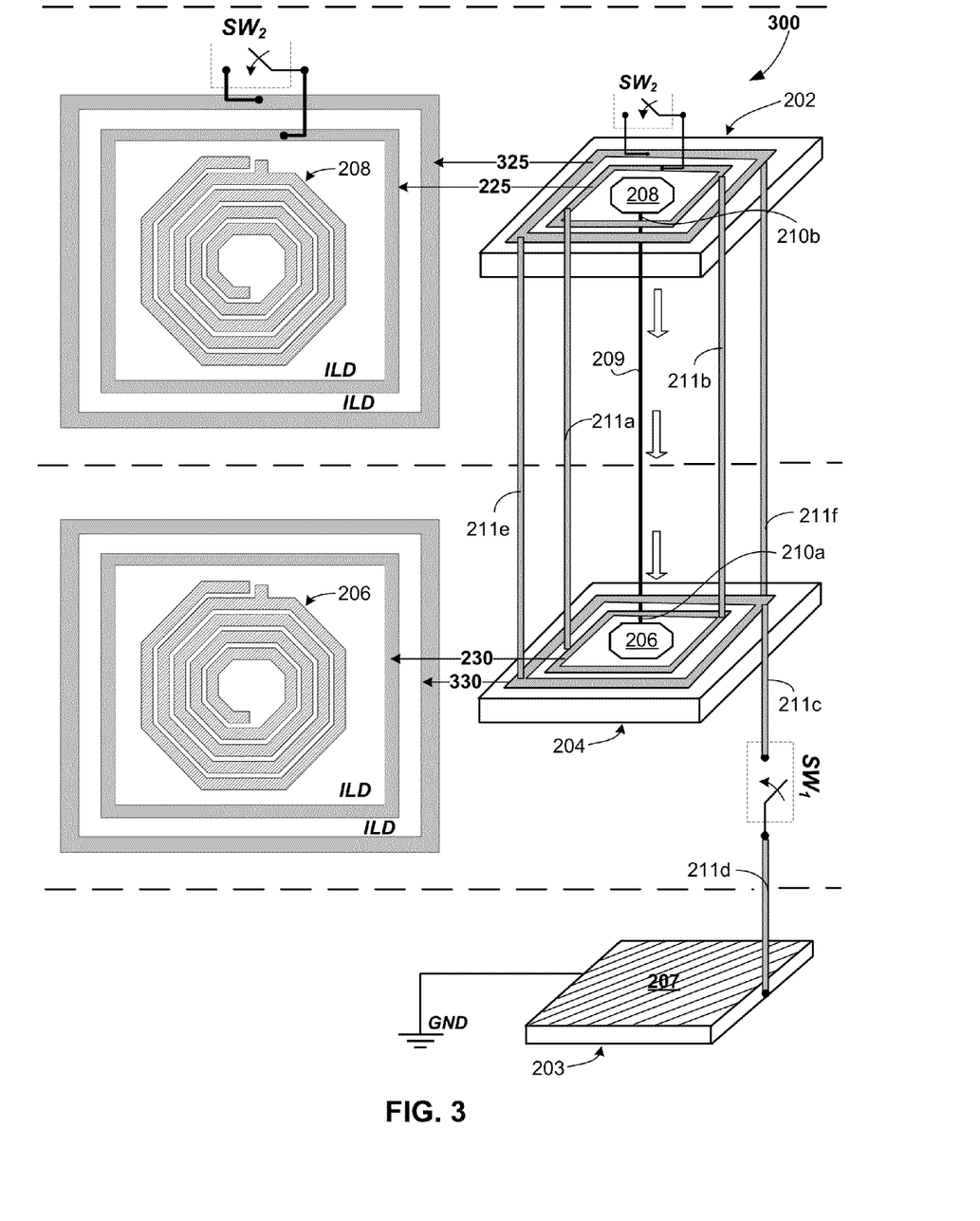
FIG. 3 illustrates an on-chip stacked reconfigurable inductor structure, according to another embodiment of the invention.

FIG. 3 depicts another exemplary embodiment of a reconfigurable on-chip stacked inductor 300. The depicted reconfigurable on-chip stacked inductor 300 may also be fabricated on, for example, three metal layers 202, 203, 204 corresponding to the back end of the line (BEOL) region of a semiconductor device. A first inductor such as first electrically conductive spiral track structure 206 (i.e., a coil) is formed in metal layer 204, while a second inductor such as second electrically conductive spiral track structure 208 (i.e., a coil) is formed in metal layer 202. The first electrically conductive spiral track structure 206 (i.e., inductor structure 206) is electrically coupled to the second electrically conductive spiral track structure 208 (i.e., inductor structure 208) by, for example, via connection 209, whereby the lower portion of the via 210a connects the first electrically conductive spiral track structure 206 to the second spiral track structure 208 by means of the upper portion of the via 210b.

The depicted reconfigurable on-chip stacked inductor 300 may also include a first and a third ground shielding structure such as first spiral electrically conductive track 230 and third spiral electrically conductive track 330 that are both formed in metal layer 204. As illustrated, the first spiral electrically conductive track 230 circumferentially bounds the first electrically conductive spiral track structure 206 (i.e., inductor structure 206) and is electrically isolated from inductor structure 206 by an interlayer dielectric ILD material. The third spiral electrically conductive track 330 (i.e., third ground shielding) circumferentially bounds the first spiral electrically conductive track 230 (i.e., first ground shielding) and is also electrically isolated from the first spiral electrically conductive track 230 by interlayer dielectric ILD.

Similarly, a second and a fourth ground shielding structure such as second spiral electrically conductive track 225 and fourth spiral electrically conductive track 325 are both formed in metal layer 202. As illustrated, the second spiral electrically conductive track 225 circumferentially bounds the second electrically conductive spiral track structure 208 (i.e., inductor structure 208) and is electrically isolated from inductor structure 208 by an interlayer dielectric ILD material. The fourth spiral electrically conductive track 325 (i.e., fourth ground shielding) circumferentially bounds the second spiral electrically conductive track 225 (i.e., second ground shielding) and is also electrically isolated from the second spiral electrically conductive track 225 by interlayer dielectric ILD.

The first, second, third, and fourth spiral electrically conductive tracks 230, 225, 330, 325 provide ground shielding, whereby parasitic signals from other adjacent electrical components are received and conducted away from the inductor structures 206, 208 by the first, second, third, and fourth spiral electrically conductive tracks 230, 225, 330, 325. This in turn mitigates the affect of other signals on the magnetic filed generated by the inductor structures 206, 208.

The first and the second ground shielding structures such as spiral electrically conductive tracks 230 and 225 are electrically coupled by electrical connections 211a and 211b. Similarly, the third and the fourth ground shielding structures such as spiral electrically conductive tracks 330 and 325 are electrically coupled by electrical connections 211e and 211f. Although a single electrical connection may be sufficient to electrically couple spiral electrically conductive tracks 230 and 225, both electrical connections 211a and 211b are utilized in order to provide redundancy in electrically connecting spiral electrically conductive tracks 230 and 225.

For example, if electrical connection 211a breaks, electrical connection 211b still establishes an electrical coupling between spiral electrically conductive tracks 230 and 225. Alternatively, if electrical connection 211b breaks, electrical connection 211a establishes an electrical coupling between spiral electrically conductive tracks 230 and 225. Thus, two or more electrical connections between spiral electrically conductive tracks 230 and 225 may be contemplated.

Similarly, although a single electrical connection may be sufficient to electrically couple spiral electrically conductive tracks 330 and 325, both electrical connections 211e and 211f are utilized in order to provide redundancy in electrically connecting spiral electrically conductive tracks 330 and 325.

For example, if electrical connection 211e breaks, electrical connection 211f still establishes an electrical coupling between spiral electrically conductive tracks 330 and 325. Alternatively, if electrical connection 211f breaks, electrical connection 211e establishes an electrical coupling between spiral electrically conductive tracks 330 and 325. Thus, two or more electrical connections between spiral electrically conductive tracks 330 and 325 may also be contemplated.

The depicted reconfigurable on-chip stacked inductor 300 includes a switch $SW_1$ and a ground plane 207 that is formed in metal layer 203. The switch $SW_1$ may provide electrical coupling between both the ground shielding structures provided by the spiral electrically conductive tracks 230, 225, 330, 325 and ground plane 207. The depicted reconfigurable on-chip stacked inductor 300 also includes a switch $SW_2$ that may provide electrical coupling between the ground shielding structures provided by spiral electrically conductive tracks 225 and 325 within metal layer 202. Since the first and the second ground shielding structures provided by spiral electrically conductive tracks 230 and 225 are electrically coupled by electrical connections 211a and 211b and, the third and the fourth ground shielding structures provided by spiral electrically conductive tracks 330 and 325 are electrically coupled by electrical connections 211e and 211f, actuating switch $SW_2$ to a closed position provides an electrical coupling between all the ground shielding structures provided by spiral electrically conductive tracks 230, 225, 330, and 325. Thus, the actuation of switches $SW_1$ and $SW_2$ provide different inductance values based on the grounding configuration of the spiral electrically conductive tracks 230, 225, 330, 325.

For example, in a first switch mode, when switch $SW_1$ and $SW_2$ are both actuated to a closed position, the ground shielding structures provided by the spiral electrically conductive tracks 230, 225, 330, 325 are connected to the ground reference GND by ground plane 207. Specifically, an electrical connection is established from the electrically coupled spiral electrically conductive tracks 230, 225, 330, 325, the electrical connection 211c, switch $SW_1$, the electrical connection 211d, and ground plane 207, to ground GND.

For example, in a second switch mode, when switch $SW_1$ and $SW_2$ are actuated to an open position, the ground shielding structures provided by the spiral electrically conductive tracks 230, 225, 330, 325 are electrically floating with respect to the ground reference GND. Specifically, while an electrical connection is maintained between spiral electrically conductive tracks 230 and 225 via electrical connections 211a and 211b, an electrical path through electrical connections 211c and 211d to the ground plane 207 and, thus, GND, is broken by switch $SW_2$. Also, while an electrical connection is maintained between spiral electrically conductive tracks 330 and 325 via electrical connections 211e and 211f, an electrical path through electrical connections 211c and 211d to the ground plane 207 and, thus, GND, is also broken by switch $SW_1$.

For example, in a third switch mode, switch $SW_1$ may be actuated to a closed position while $SW_2$ is actuated to an open position. Thus, in such a switch configuration, the ground shielding structures provided by spiral electrically conductive tracks 230 and 225 are electrically floating with respect to the ground reference GND, while the ground shielding structures provided by spiral electrically conductive tracks 330 and 325 are connected to the ground reference GND by ground plane 207.

The inductor structures provided by the first and the second electrically conductive spiral track structures 208, 206 operate in an identical, or substantially the same, manner to that described above in relation to the on-chip stacked inductor 200 of FIG. 2. Thus, the positive mutual inductive coupling between the first electrically conductive spiral track structure 206 and second electrically conductive spiral track structure 208 may lead to a total inductance greater than the simple sum of the inductances of the two spiral structures (i.e., 206, 208) taken by themselves. For example, a two layer spiral may experience as much as four times the inductance of the two layers (e.g., 202, 204) taken separately and summed.

Each of the first and the second electrically conductive spiral track structures 206, 208 may be constructed from an electrically conductive material such as, for example, copper, tungsten, or aluminum. Moreover, each of the first, second, third, and fourth ground shielding structures such as spiral electrically conductive tracks 230, 330, 225, and 325 may similarly be constructed from an electrically conductive material such as, for example, copper, tungsten, or aluminum.

The above-described electrically conductive spiral track structures 206, 208 and the ground shielding structures provided by spiral tracks 230, 330, 225, and 325 may be lithographically formed (i.e., photolithography and etching) on the metal layers 202, 204 of a semiconductor device, whereby upon the deposition of an interlayer dielectric (ILD) material over each metal layer, both laterally and vertically adjacent electrically conductive spiral tracks (e.g., 206, 208, 230, 330, 225, 325) are insulted by the ILD material.

The thickness of the spiral tracks (e.g., 206, 208, 230, 330, 225, 325) may be limited to the metal layer thicknesses while the width of the spiral tracks may be designed to range from approximately 1-50 µm, preferably between about 1-10 µm. Metal layer 203 may be about 3 µm, metal layer 204 may be about 6 µm, and metal layer 202 may be approximately 4 µm, however, different layer thicknesses may be contemplated depending on the choice of semiconductor technology.

As previously described, upon actuation of both switch $SW_1$ and $SW_2$ to an open position according to the second switch mode, the first, second, third, and fourth spiral electrically conductive tracks 230, 225, 330, 325 providing the ground shielding structures are electrically floating. Under these operating conditions, a first inductance value may be generated that is governed by the positive mutual inductive coupling between the first electrically conductive spiral track structure 206 (i.e., inductor structure 206) and second electrically conductive spiral track structure 208 (i.e., inductor structure 208).

However, in the first switch mode, upon actuation of switch $SW_1$ and $SW_2$ to a closed position, the first, second, third, and fourth spiral electrically conductive tracks 230, 225, 330, 325 providing the ground shielding structures are electrically coupled to ground through ground plane 207. In contrast to the second switch mode where switches $SW_1$ and $SW_2$ are in an open position, the grounded first, second, third, and fourth spiral electrically conductive tracks 230, 225, 330, 325, and the ground plane 207, confine the magnetic field generated by inductor structures 206 and 208 between the ground shielding first, second, third, and fourth spiral electrically conductive tracks 230, 225, 330, 325 and the ground plane 207, which in turn generates a second increased inductance value compared to the first inductance value.

In a third switch mode, whereby switch $SW_1$ is actuated to a closed position and $SW_2$ is actuated to an open position, the ground shielding structures provided by spiral electrically conductive tracks 230 and 225 are electrically floating with respect to the ground reference GND, while the ground shielding structures provided by outer spiral electrically conductive tracks 330 and 325 are connected through $SW_1$ to GND. Here, the grounded third and fourth spiral electrically conductive tracks 330, 325, and the ground plane 207, confine the magnetic field generated by inductor structures 206 and 208 between the ground shielding third and fourth spiral electrically conductive tracks 330, 325 and the ground plane 207, which in turn generates a third increased inductance value compared to the first inductance value. However, by only grounding the outer third and fourth spiral electrically conductive tracks 330, 325 while the inner first and second spiral electrically conductive tracks 230, 225 are floating, the confinement of the magnetic field generated by inductor structures 206 and 208 may differ relative to when all of the electrically conductive tracks 230, 225, 330, 325 are grounded. In this third switch mode, the generated third inductance value may be larger than the first inductance value, but less than the second inductance value. The inclusion of additional shielding structures within each metal layer may vary each discrete inductance value based on the configuration of the switches. However, the resolution of the inductance variations with the changing switch configurations may differ when each metal level includes, for example, two (2) shielding structures (e.g., 230, 330). This is demonstrated by referring to FIG. 4, which additionally depicts a graph 400 of experimental results corresponding to reconfigurable on-chip stacked inductor 300 (FIG. 3).

Referring to FIG. 4, overlapping curves 406 correspond to the inductance values of the on-chip stacked inductor 300 of FIG. 3 when switches $SW_1$ and $SW_2$ are actuated based on the above-described three (3) switch modes. As depicted, based on the addition of a shielding structure (i.e., 330, 325) within each metal layer, the inductance curves 406 lie between curves 402 and 404, which correspond to the on-chip stacked inductor 200 of FIG. 2. For example, at an operating frequency of 50 GHz, the inductance value of on-chip stacked inductor 300 (FIG. 3) is about 191 pH, which lies between the 177 pH (i.e., curve 402) and 200 pH (i.e., curve 404) inductance values exhibited by on-chip stacked inductor 200 (FIG. 2). As depicted, the discrete inductance values generated by on-chip stacked inductor 300 (FIG. 3) is less sensitive to changes in switch mode (i.e., first, second, or third switch mode) compared to on-chip stacked inductor 200 (FIG. 2).

As illustrated by curves 406, the inductance curves for the different switch modes (i.e., first, second, or third switch mode) substantially overlap. However, the embodiment of on-chip stacked inductor 300 (FIG. 3) may be implemented in four or more metal layers, whereby, for example, the two electrically conductive tracks (e.g., 230, 330) per each metal layer (e.g., 204) may exist on three or more metal layers. By extending the on-chip stacked inductor 300 over additional metal layers, the inductance curves for the different switch modes (i.e., first, second, or third switch mode) separate and become more discrete. Thus, the on-chip stacked inductor 300 of FIG. 3 may be utilized when a finer resolution of discrete inductance value may be required. Moreover, based on the two (2) switches $SW_1$, $SW_2$, the on-chip stacked inductor 300 of FIG. 3 may generate three (3) discrete inductance ranges that correspond to the three (3) switch modes.

In both the embodiments depicted in FIGS. 2 and 3, the ground shielding structures improve the tunability range, as defined by the curves illustrated in FIG. 4, which are indicative of inductance variations (i.e., maximum & minimum values) over a range of operating frequencies (e.g., 20-100 GHz). Moreover, the inclusion of the one or reconfigurable switches (i.e., $SW_1$, $SW_2$) enable the generation of discrete inductance values at each operating frequency, as indicated by the curves 402-406.

Although the ground shielding structures provided by the electrically conductive tracks 230, 225, 330, 325 may have the same or similar widths to that of the inductor structures 206, 208, it may be appreciated that wider or narrower track widths may be contemplated. Moreover, the lateral separation between the inductor structures (e.g., 206, 208) and their respective laterally adjacent one or more shielding structures (e.g., 230, 225, 330, 325) may vary in accordance with a desired inductance value and tunability range, which may be determined by characterizing the structure (e.g., simulation or test) and presenting the results in a graph such as, for example, graph 400 (FIG. 4). Also, although the thickness of the ground shielding structures provided by the electrically conductive tracks 230, 225, 330, 325 may be the same as or similar to that of the inductor structures (e.g., 206, 208), the thickness or height of the ground shielding structures provided by the electrically conductive tracks 230, 225, 330, 325 may be increased above the top surface of the inductor structures (e.g., 206, 208). Alternatively, in accordance with some embodiments, the thickness or height of the ground shielding structures provided by the electrically conductive tracks 230, 225, 330, 325 may be decreased to be below the top surface of the inductor structures (e.g., 206, 208).

For example, according to one embodiment, each spiral track formed within a respective metal layer may include a square-shaped single turn (i.e., n=1) spiral track having a thickness of about 1.2 μm and an outer diameter of about 40 μm. The inductor (i.e., two-layers) may be formed within the top two metal layers of a 17-metal BEOL Cu stack. Also, the ground plane may include a fish-bone shaped ground plane formed on a 0.075 μm M1 layer.

It may be appreciated that the above described exemplary on-chip reconfigurable inductor structures may also be implemented as discrete inductor components without necessarily being formed on a semiconductor or other substrate type used to manufacture an integrated circuit.

Figure 5:
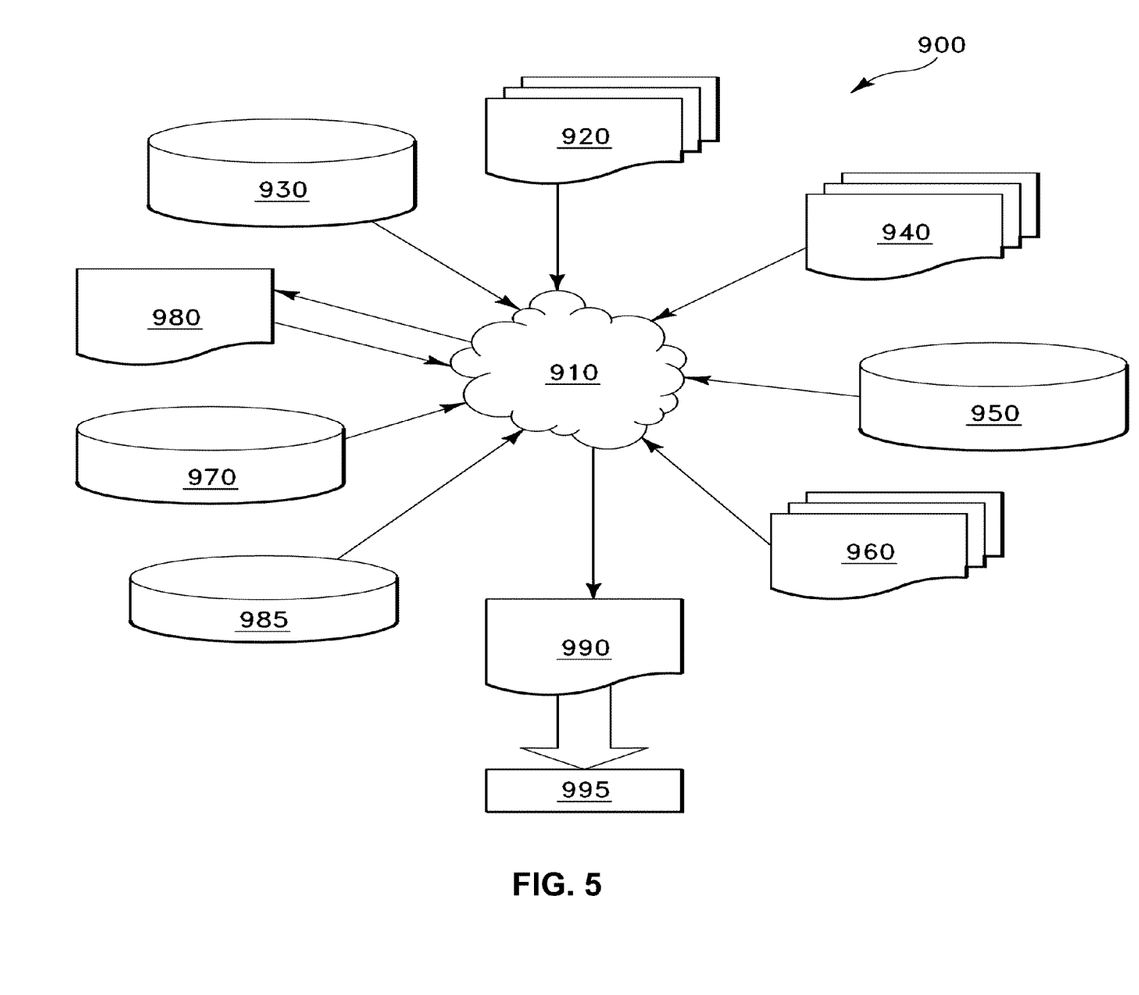
FIG. 5 is a flow diagram of a design process used in semiconductor design, manufacture, and/or test.

FIG. 5 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structure and/or device described above and shown in FIGS. 2-3. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. In one embodiment, the design structure 920 comprises design data used in a design process and comprising information describing the embodiments of the invention with respect to the structures as shown in FIGS. 2-3. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention, as shown in FIGS. 2 and 3. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2 and 3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2 and 3 to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIGS. 2 and 3. In one embodiment, design structure 990 may comprise a compiled, executable HDL simulation model that functionally simulates the device structures shown in FIGS. 2 and 3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 2 and 3. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A reconfigurable multi-stack inductor structure formed within a semiconductor structure, comprising:
    a first inductor structure located within a first metal layer of the semiconductor structure;
    a first ground shielding structure located within the first metal layer that is electrically isolated from and circumferentially bounds the first inductor structure;
    a second inductor structure located within a second metal layer of the semiconductor structure, the second inductor structure electrically coupled to the first inductor structure;
    a second ground shielding structure located within the second metal layer that is electrically isolated from and circumferentially bounds the second inductor structure, wherein the first and the second inductor generate a first inductance value based on the first ground shielding structure and the second ground shielding structure being coupled to a ground reference, and wherein the first and the second inductor structure generate a second inductance value based on the first and the second ground shielding structure electrically floating;
    a ground plane located within a third metal layer of the semiconductor structure; and
    a first switch coupled between the ground plane and the first and the second ground shielding structure, wherein upon actuation of the first switch to a closed position, the first ground shielding structure and the second ground shielding structure are coupled to the ground reference provided by the ground plane to generate the first inductance value, and wherein upon actuation of the first switch to an open position, the first ground shielding structure and the second ground shielding structure are electrically isolated from the ground reference provided by the ground plane to generate the second inductance value.

2. The structure of claim 1, further comprising:
    a third ground shielding structure located within the first metal layer that is electrically isolated from and circumferentially bounds the first ground shielding structure;
    a fourth ground shielding structure located within the second metal layer that is electrically isolated from and circumferentially bounds the second ground shielding structure;
    at least one first electrical connection electrically coupling the first and the second ground shielding structure;
    at least one second electrical connection electrically coupling the third and the fourth ground shielding structure; and
    a second switch that electrically connects the first ground shielding structure and the third ground shielding structure, wherein upon actuation of the second switch to a closed position, each of the first, the second, the third, and the fourth ground shielding structure are electrically coupled, and wherein upon actuation of the second switch to an open position, the first and the second ground shielding structure are electrically isolated from the third and the fourth ground shielding structure.

3. The structure of claim 1, further comprising:
    at least one electrical connection that electrically couples the first and the second ground shielding structure.

4. The structure of claim 1, wherein the first inductor structure comprises a first electrically conductive spiral track structure having a first outer track.

5. The structure of claim 4, wherein the first ground shielding structure comprises a first spiral electrically conductive track located adjacent the first outer track, the first spiral electrically conductive track and adjacent first outer track electrically isolated by a dielectric material located therebetween.

6. The structure of claim 1, wherein the second inductor structure comprises a second electrically conductive spiral track structure having a second outer track.

7. The structure of claim 6, wherein the second ground shielding structure comprises a second spiral electrically conductive track located adjacent the second outer track, the second spiral electrically conductive track and adjacent second outer track electrically isolated by a dielectric material located therebetween.

8. The structure of claim 4, wherein the first and the second electrically conductive spiral track structure comprise a track width of 1-4 µm.

9. The structure of claim 1, wherein the first and the second metal layer comprise a thickness of 3 µm.

10. A design structure tangibly embodied in a machine readable medium for designing, manufacturing, or testing an integrated circuit, the design structure comprising:
    a first inductor structure located within a first metal layer of the semiconductor structure;

a first ground shielding structure located within the first metal layer that is electrically isolated from and circumferentially bounds the first inductor structure;

a second inductor structure located within a second metal layer of the semiconductor structure, the second inductor structure electrically coupled to the first inductor structure;

a second ground shielding structure located within the second metal layer that is electrically isolated from and circumferentially bounds the second inductor structure, wherein the first and the second inductor generate a first inductance value based on the first ground shielding structure and the second ground shielding structure being coupled to a ground reference, and wherein the first and the second inductor structure generate a second inductance value based on the first ground shielding structure and the second ground shielding structure electrically floating;

a ground plane located within a third metal layer of the semiconductor structure; and a first switch coupled between the ground plane and the first and the second ground shielding structure, wherein upon actuation of the first switch to a closed position, the first ground shielding structure and the second ground shielding structure are coupled to the ground reference provided by the ground plane to generate the first inductance value, and wherein upon actuation of the first switch to an open position, the first ground shielding structure and the second ground shielding structure are electrically isolated from the ground reference provided by the ground plane to generate the second inductance value.

11. The design structure of claim 10, further comprising:

a third ground shielding structure located within the first metal layer that is electrically isolated from and circumferentially bounds the first ground shielding structure;

a fourth ground shielding structure located within the second metal layer that is electrically isolated from and circumferentially bounds the second ground shielding structure;

at least one first electrical connection electrically coupling the first and the second ground shielding structure;

at least one second electrical connection electrically coupling the third and the fourth ground shielding structure; and a second switch coupled between the first ground shielding structure and the third ground shielding structure, wherein upon actuation of the second switch to a closed position, each of the first, the second, the third, and the fourth ground shielding structure are electrically coupled, and wherein upon actuation of the second switch to an open position, the first and the second ground shielding structure are electrically isolated from the third and the fourth ground shielding structure.

* * * * *